(12) United States Patent
Günther et al.

(10) Patent No.: US 7,455,539 B2
(45) Date of Patent: Nov. 25, 2008

(54) CIRCUIT BOARD WITH LEVER-LATCH HANDLE

(75) Inventors: Hans-Ulrich Günther, Pfinztal (DE); Volker Haag, Bad Wildbad (DE); Stefan Hauber, Oberhaching (DE); Michael Joist, Gaggenau (DE); Klaus Pfeifer, Karlsruhe (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 11/643,292

(22) Filed: Dec. 21, 2006

(65) Prior Publication Data
US 2007/0149018 A1 Jun. 28, 2007

(30) Foreign Application Priority Data
Dec. 23, 2005 (EP) ................... 05028353

(51) Int. Cl.
*H01R 13/62* (2006.01)

(52) U.S. Cl. ...................... 439/160; 439/157

(58) Field of Classification Search ............... 439/160, 439/157, 152
See application file for complete search history.

(56) References Cited

U.S. PATENT DOCUMENTS

| 5,675,475 A | 10/1997 | Mazura et al. |
| 5,989,043 A * | 11/1999 | Han et al. .................... 439/157 |
| 6,266,248 B1 * | 7/2001 | Hanas et al. ................. 361/752 |
| 6,354,164 B1 * | 3/2002 | Megason et al. .............. 74/109 |
| 2002/0182909 A1 | 12/2002 | Stathopoules et al. |
| 2005/0274592 A1 | 12/2005 | Yang |

FOREIGN PATENT DOCUMENTS

WO WO 0047028 A1 8/2000

* cited by examiner

*Primary Examiner*—Renee Luebke
*Assistant Examiner*—Vanessa Girardi
(74) *Attorney, Agent, or Firm*—Gardere Wynne Sewell LLP

(57) ABSTRACT

A plug-in circuit board for insertion into and withdrawal from a rack having at least one front profile rail includes a front plate and a lever-latch handle with a gripping bar pivotably-mounted to the front of the plug-in circuit board. The gripping bar includes an elastically deflectable tongue which, in the pushed-in state of the plug-in circuit board, engages the front plate by a magnetic force between a magnetized stop on the front plate and the tongue.

13 Claims, 4 Drawing Sheets

CIRCUIT BOARD WITH LEVER-LATCH HANDLE

BACKGROUND OF THE INVENTION

The present invention pertains to a plug-in circuit board for insertion into and withdrawal from a rack which has at least one front profile rail, the circuit board including a front plate and a pivotably-mounted, lever-latch handle with a gripping bar.

In order to insert a plug-in circuit board into a rack, or in order to pull it out again from the rack, push in and pull out devices have long been known in the art. In the past various types of lever-latch handles and levers have been developed for insertion and removal of the plug-in circuit board. The forces to be applied for insertion and removal depend in large measure on the number of poles and plug connectors located on the back side of the plug-in circuit board and that are connected to corresponding plug-in connectors on the so called backplane of the rack. These multi-way connectors have, in recent times, been provided with an increased number of pins, so that the forces to be applied for insertion and removal are also increasing. Accordingly, the lever and lever-latch handle has to be made increasingly sturdier. Due to the use of multi-pin plug-in connectors on the back side of plug-in circuit boards, elastic deformations of individual components of the overall plug-in circuit board will occur due to the large plug-in forces.

During the process of placing a plug-in circuit board into a rack, the lever path of the lever-latch handle is limited either by a front plate located in the front region of the plug-in circuit board, or by a separate stop. The limitation of the lever path of the lever-latch handle keeps the push-in operation from being entirely completed, since the large plug-in forces at the multiple pin plug connectors cannot be overcome. Consequently, an elastic spring back of the plug-in circuit board or a reverse deformation of the plug-in circuit board will occur. The plug-in circuit board will then not fit flush with the rack and a visible gap will be formed in the front region between the plug-in circuit board and the rack, which has an adverse impact on the shielding effect of the rack.

Modern subassemblies are pushed into the rack in the inactive state. Once they are fully inserted, they will be activated because a switch located on the plug-in circuit board is operated. If the plug-in circuit board is not fully inserted into the rack, or if a spring-back of the plug-in circuit board occurs, then the switch will not be satisfactorily operated. The plug-in circuit board either will not be switched to become active, or a chattering of the switch may occur.

Also, in an attempt to pivot the lever-latch handle past its stop, damage to the lever, to the front plate and to the stop may occur due to the overtravel, or deformations of individual components may result.

In the telecommunications industry, plug-in circuit boards with a standardized lever are known that are designated as so called ATCA handles. These plug-in circuit boards have an additional magnetic stop, for example, in their front region, against which the metal lever-latch handle rests when the plug-in circuit board is in the pushed in state and by which it is held in its intended position. If the plug-in circuit board is not pushed in entirely due to the large plug in forces at the back side plug-in connector, then there will also be a spring-back or a reverse deformation of the plug-in circuit board as well. The lever will then not be held in its end position by the magnet. Any pivoting past the normal end position will also lead to damage to the stop and/or to the plug-in circuit board.

Therefore, it is the objective of the present invention to overcome the disadvantages of the prior art and to propose a lever-latch handle that will allow a certain amount of over-travel in order to avoid the spring-back of the entire assembly and damage to the plug-in circuit board or to the lever.

SUMMARY OF THE INVENTION

The present invention provides a plug-in circuit board for insertion into and withdrawal from a rack that has at least one front profile rail, the circuit board including a front plate and a lever-latch handle with a gripping bar pivotably-mounted in the front region of the circuit board. An arm or bar of the lever-latch handle includes an elastic tongue which, in the pushed-in state of the plug-in circuit board, sticks to the front plate so that the lever-latch handle is secured in its intended end position. The elastic tongue of the gripping bar has a spring-like design and can also be designed as a spring tongue. Thus, it will also have cushioning properties, so that forces that act on the pivot latch handle will not be transferred in their entirety, but rather in an attenuated manner, from the elastic tongue to the plug-in circuit board. Due to the formation of the elastic tongue on the pivot latch handle, additional pivoting of the pivot latch handle past its intended end position is still possible. Damage due to large forces that act on the plug-in circuit board will thus be substantially and reliably prevented.

In accordance with another aspect of the invention, the elastic tongue of the gripping bar also makes possible a spring back of the pivot latch handle into its intended end position after the pivot latch handle has pivoted past this intended end position to the maximum end position. After this overtravel, the lever-latch handle will thus be moved automatically back into its intended end position. Thus, the elastic tongue is always adhered to the front plate. The lever-latch handle will then be fixed in the intended end position. Still further, the tongue is preferably made of an elastically deformable material. If forces are transferred to the tongue of the lever-latch handle, then the material will be elastically deformed. Thus, a rigid connection between the tongue and the lever-latch handle will result that does not have to be elastic.

The elastic spring-back properties of the lever, which are determined by a suitable selection of the material, are chosen so that the lever-latch handle will spring back by itself to its intended end position after the overtravel. The lever-latch handle will then be held reliably in this position. The same also applies after the application of shock and vibration to the plug-in circuit board, so that, even in the case of jolts to the plug-in circuit board, the lever-latch handle will remain securely fixed in its set intended end position.

Due to suitable selection of the dimensions of the lever and the tongue, the elasticity will be achieved primarily in the actuation direction, whereas the lever-latch handle remains essentially bending resistant in the transverse direction.

Alternatively, or additionally, an elastic connection can also be formed between the tongue and the lever-latch handle or the gripping bar. A connection of this kind may be provided, for example, by a spring articulation. In this case, the tongue can also comprise a rigid or less elastic material.

In one preferred embodiment of the invention, a plug-in circuit board is provided wherein a gap is formed between one free end of the tongue and the gripping bar. Thus, the gripping bar or the lever-latch handle can be pressed in the direction of the front plate and past the intended end position of the lever-latch handle, by the amount of the gap. The elastic tongue makes possible an additional pivoting of the lever-latch handle past the intended end position, until the gripping bar is pressed in a spring like manner against the free end of the tongue. Therefore, the tongue will remain resting against or adhered to the front plate. The force exerted by the gripping bar of the lever-latch handle will be cushioned and transferred at a reduced rate to the front plate against which the tongue is resting. Only when the gripping bar rests against the tongue will the force exerted by the gripping bar be transferred completely to the front plate of the plug-in circuit board, and the lever path of the lever-latch handle will be limited.

Preferably, the gap between the free end of the tongue and the gripping bar is designed so that the tongue will be positioned essentially parallel to the gripping bar. The gap between the tongue and gripping bar can be produced by provision of a slot in the gripping bar. This can be effected, for example, by sawing or by laser cutting.

Still further, possible overtravel, that is, movement of the gripping bar past the intended end position, is specified by a suitable selection of the gap between tongue and gripping bar. The gap has a dimension, preferably, of about 0.2 mm to 2.0 mm, and, preferably, it is dimensioned so that an overtravel on the order of about 0.5 mm to 1.0 mm is possible. This gap width is sufficient so that the plugs located on the back side of the plug-in circuit board can be reliably pushed into the plug connectors of the backplane. Also, providing a slot between the tongue and gripping bar will mean that improper operation of the lever-latch handle or damage to the plug-in circuit board and/or to the lever-latch handle will be avoided.

Preferably, the tongue of the lever-latch handle will adhere magnetically to the front plate. Thus, the lever-latch handle will be kept in its position in a simple manner. The magnetic adhesion connection also makes possible a convenient detachment. An operator who grasps the lever-latch handle by the gripping bar needs only to overcome the magnetic force between tongue and front plate, and can pivot the lever-latch handle away from the front plate so that the plug-in circuit board on the rack can be removed or pulled out. No mechanical lock, additional lever, or union need be operated. Therefore, release of the lever-latch handle from its set, end position is uncomplicated. Moreover, the magnetic connection will ensure a dependable retention of the lever in its intended end position.

In one favorable embodiment of the plug-in circuit board according to the invention, a protruding stop is formed on the front plate and this stop can be magnetized. The stop is located in the region where the free end of the tongue is found when the lever-latch handle is located in its intended end position. At least the free end of the tongue will then be made of ferromagnetic material.

Due to such a configuration, the free end of the tongue rests against the magnetic stop and is held in position by it when the lever-latch handle is located in its intended end position. The entire tongue or the entire lever-latch handle can also be made of ferromagnetic material. In this case, an iron containing steel or a steel alloy would be suitable.

The protruding stop can be designed as a small magnet. The retention force of the magnetic connection between tongue and stop will be determined by the size of the stop and by the selection of the magnetizable material. The stop may be provided in the form of a hub or a small head on the front plate and may be screwed into a threaded hole, for example, provided in the front plate. It is also possible to weld on the stop or to connect it in another manner to the front plate. The advantage of the protruding stop is that the shape of the lever-latch handle can be selected so that, in its intended end position, the lever-latch handle will extend essentially parallel to the front plate. Due to the spacing between lever-latch handle and front plate that is determined by the size of the stop, a gap will be formed so that the user can easily operate the pivot latch handle.

It is also possible in accordance with the invention to provide the stop for the front plate using iron containing or ferromagnetic material, and to design at least the free end of the tongue using magnetizable or magnetic material.

Preferably, the tongue has a stem in the vicinity of its free end that makes contact with a switch located behind the front plate. The placement of the stem on the tongue of the gripping bar will ensure that the circuit board will be switched to become active as soon as the lever-latch handle has reached its intended end position. The elasticity of the tongue will ensure that forces exerted on the lever-latch handle will be transferred in an attenuated manner to the stem and thus to the switch of the circuit board. Thus, a reliable protection will be ensured against damage to or destruction of the switch during insertion of the plug-in circuit board into the rack, and a dependable contacting and actuation of the switch will be assured.

When pulling out the plug-in circuit board from the rack, the switch will likewise be actuated by the stem so that the plug-in circuit board will become inactive as soon as the tongue is moved from its intended end position. In the case of a magnetic connection between the tongue and stop at the front plate of the plug-in circuit board, the plug-in circuit board will be switched to inactive when the magnetic connection is released, that is, once the magnetic force of attraction is overcome.

In order for the stem on the tongue of the gripping bar to contact the switch located behind the front plate, the front plate may be provided with a recess or cutout so that the stem can project through this recess into the interior of the plug-in circuit board.

In one preferred embodiment of the plug-in circuit board according to the invention, the tongue of the lever-latch handle is provided with a sinuous shape which may increase the elasticity of the tongue. Thus it is easier to move the lever-latch handle beyond its set, end position. This overtravel is easy to realize. At the same time, forces exerted on the lever-latch handle will be more greatly cushioned. Damage to the front plate or to the plug-in circuit board will be reliably prevented.

The sinuous formation of the tongue has proven to be very advantageous, in particular, when a stem is located on the tongue of the lever-latch handle for actuating a switch of the plug-in circuit board. Forces exerted on the switch are clearly reduced, since the tongue is very flexible. In this way the switch will be very dependably protected from damage.

Preferred embodiments of the invention will be explained in greater detail in conjunction with the drawing figures.

BRIEF DESCRIPTION OF THE DRAWING FIGURES

DETAILED DESCRIPTION OF THE PREFERRED EMBODIMENTS

Figure 1:
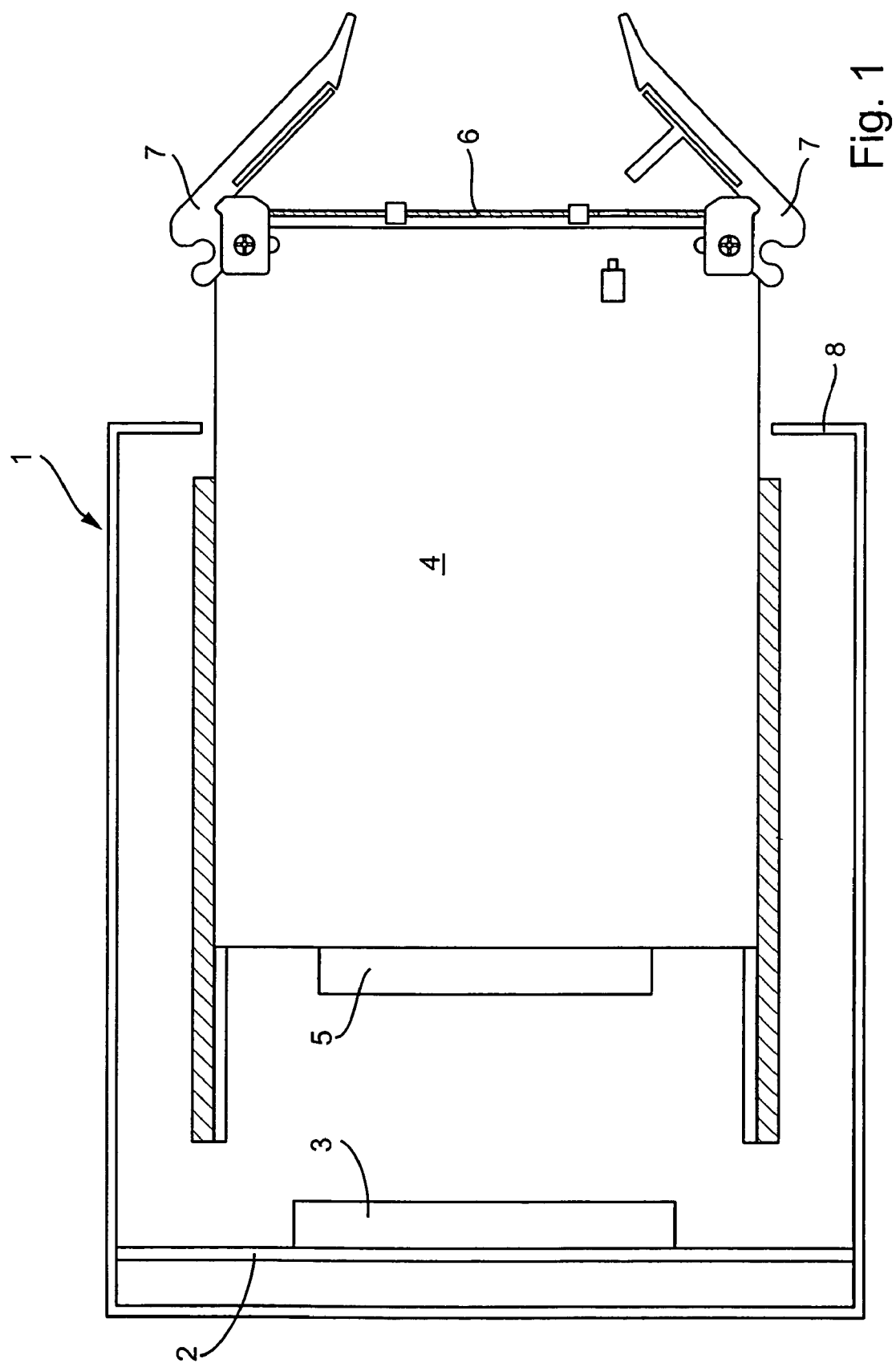
FIG. 1 is a longitudinal cross section through a rack with a plug-in circuit board in accordance with the invention.

In the description which follows like parts are marked with the same reference numerals, respectively.

FIG. 1 illustrates a rack 1 whose rear region is composed of a back wired circuit board 2. A multi-way connector 3 is provided on the back-wired circuit board 2. A plug-in circuit board 4 has a plug 5 on its back side that produces a connection with the multi-way connector 3 in the installed state of the plug-in circuit board 4.

The plug-in circuit board 4 includes a front plate 6 in its frontal region. Upper and lower lever-latch handles 7 are located at the upper and lower corners of the front plate 6. To push the plug-in circuit board 4 into or pull it out of the rack 1, the lever-latch handles 7 engage a front, profile rail or wall 8 of the rack 1.

Figure 2:
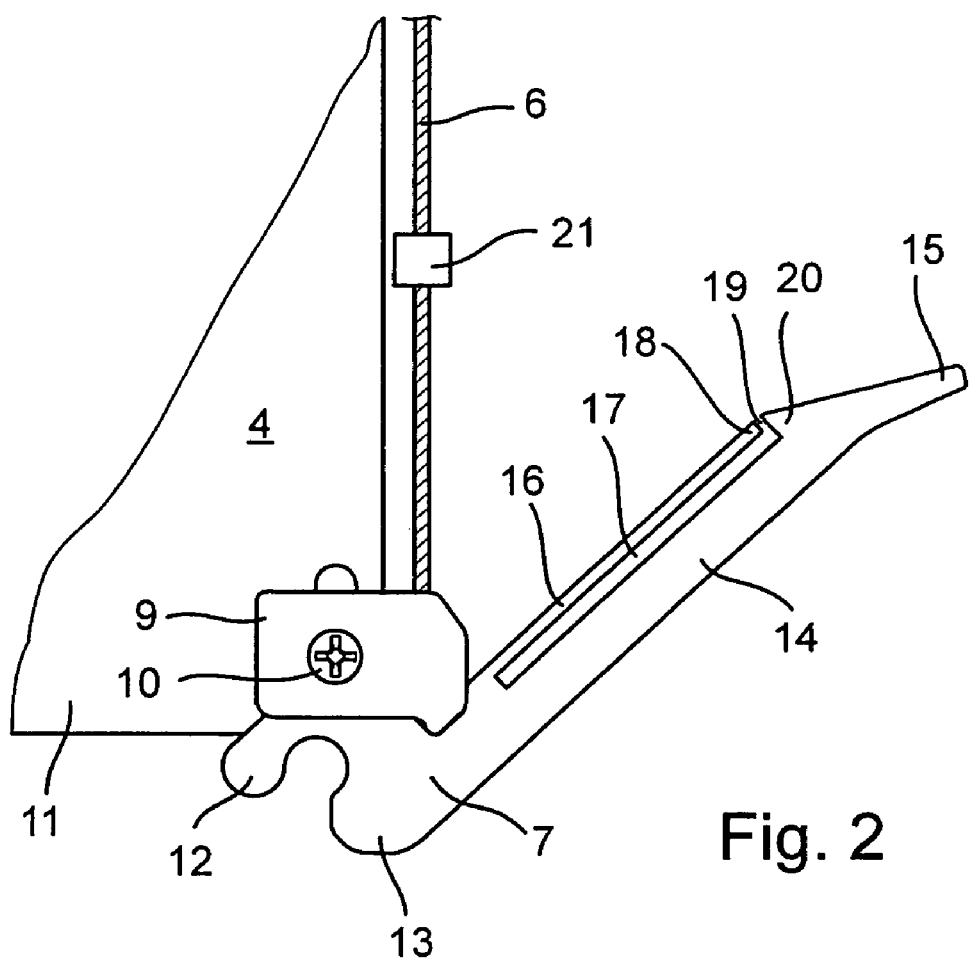
FIG. 2 is a detail view of the lower front corner of the plug-in circuit board, including a lever-latch handle as shown in FIG. 1.

FIG. 2 shows in detail the lower front corner of the plug-in circuit board 4 with the lower lever-latch handle 7. The lower front corner of the plug-in circuit board 4 is provided with an attachment adapter 9. The attachment adapter 9 has a rotary bearing or pivot pin 10 in the form of a screw on which the lever-latch handle 7 is mounted and around which the lever-latch handle can pivot. The screw or pin 10 also secures the attachment adapter 9 to the front plate 6 and to a circuit board member 11 of the plug-in circuit board 4.

The lever-latch handle 7 includes a spur 12 at its lower end near the pivot pin 10. The spur 12 engages into the profile rail 8 when the plug-in circuit board 4 is fully inserted into the rack 1. Adjacent to the spur 12, the lever-latch handle 7 has a jacking shoulder 13 that is facing away from the plug-in circuit board 4. A handle gripping bar 14 extends upward from the jacking shoulder 13.

Gripping bar 14 has on its upper end a tip 15 slanting away from the plug-in circuit board 4 whereby the gripping bar 14 can be held and operated by the user. In the middle region of the gripping bar 14 there is an elongated tongue 16 extending parallel to the gripping bar. A gap 17 is formed between the tongue 16 and the gripping bar 14. The tongue 16 is attached to the gripping bar 14 at its lower end. A free end 18 of the tongue 16 is spaced a predetermined distance from the gripping bar 14, so that a space 19 is formed between the tongue and a protrusion 20 of the gripping bar 14. The tongue 16 can therefore move or deflect elastically at its free end 18. Elastic deflection of the tongue 16 is thus limited in one direction by the width of the gap 17.

Referring further to FIG. 2, a stop 21 is provided at the front plate 6, in the region where the free end 18 of the tongue 16 is located, when the lever-latch handle 7 is pivoted into its intended end position parallel to the front plate 6. The stop 21 is secured to the front plate 6 and protrudes somewhat. When the lever-latch handle 7 is pivoted into its intended end position, the tongue 16 will rest against the stop 21. The stop 21 also comprises a magnet and the free end 18 of the tongue 16 is formed of ferromagnetic material. The lever-latch handle 7 is thus fixed in its intended end position due to the magnetic force or connection between the stop 21 and the tongue 16.

Figure 3:
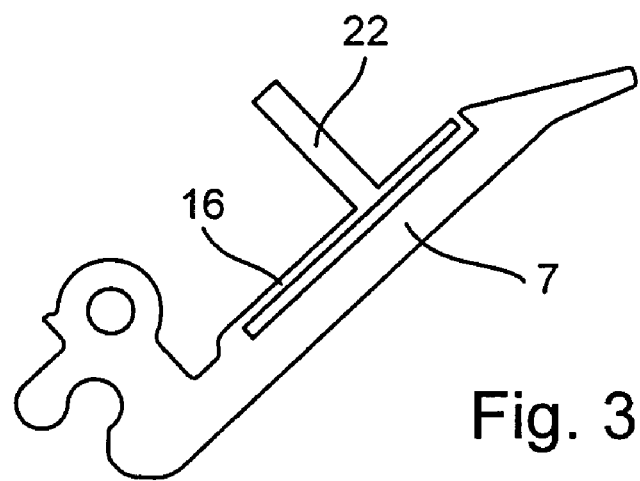
FIG. 3 is a detail view of a first alternate embodiment of the lever-latch handle.

Referring now to FIG. 3, an alternate embodiment of the lever-latch handle 7, is illustrated in which the tongue 16 of the lever-latch handle 7 has a stem 22. The stem 22 is located in the region of the free end 18 of the tongue 16 and is positioned at a right angle to the tongue 16. The stem 22 is, preferably, about ten millimeters to fifteen millimeters long and it is used to operate a switch, not shown in FIG. 3, on the plug-in circuit board 4 in order to switch the plug-in circuit board to become active or inactive.

Figure 4:
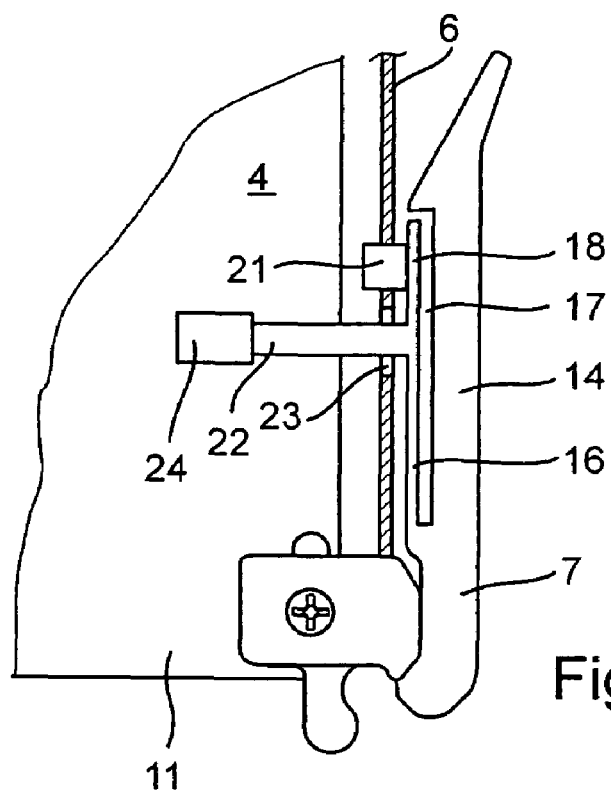
FIG. 4 is a detail view of the lower front corner of the plug-in circuit board with the lever-latch handle of FIG. 3 in the inserted state.

Referring to FIG. 4, the lower front corner of the plug-in circuit board 4 is shown with the embodiment of the lever-latch handle 7 including stem 22 when the lever-latch handle 7 is in its intended end position and the plug-in circuit board 4 is fully inserted into the rack. In this condition, the lever-latch handle 7 is aligned essentially parallel to the front plate 6. As also shown in FIG. 4, the front plate 6 has a recess 23 through which the stem 22 extends into an interior space behind the front plate 6. A suitable switch 24 is located on the circuit board 11 of the plug-in circuit board 4. The stem 22 actuates the switch 24, so that the plug-in circuit board 4 is caused to become active when the plug-in circuit board is fully inserted into the rack, and is switched to become inactive as soon as the plug-in circuit board 4 is pulled out from the rack.

As further shown in FIG. 4, the stop 21 is located at the front plate 6 of the plug-in circuit board 4 above the recess 23. The free end 18 of the tongue 16 rests against the stop 21, since the lever-latch handle 7 is located in its set, end position, that is, with the gripping bar 14 aligned generally parallel to the front plate 6. Due to the magnetic retentive force created between the stop 21 and the tongue 16, the lever-latch handle 7 is held in its position.

In order to pivot the lever-latch handle 7 away from the front plate 6 from its intended end position, the magnetic, retentive force between the stop 21 and tongue 16 must be overcome. At the beginning of the pivot motion of the lever-latch handle 7, the gripping bar 14 is moved away from the vertical by a small angle. The tongue 16 will be thereby deformed elastically, since the tongue 16 is held in its position by the magnetic stop 21. The gap 17 between the tongue 16 and the gripping bar 14 will increase in the region of the free end 18 of the tongue 16. As the lever-latch handle 7 continues to move, the magnetic retentive force between stop 21 and tongue 16 will be overcome. The tongue 16 will release from the stop 21 and the lever-latch handle will pivot toward horizontal and the plug-in circuit board 4 will be pulled out from the rack 1. The user need not operate any additional locks or unlocking mechanisms. The lever-latch handle 7 can be operated in a convenient manner, but at the same time it will be securely and dependably locked in its intended end position.

Figure 5:
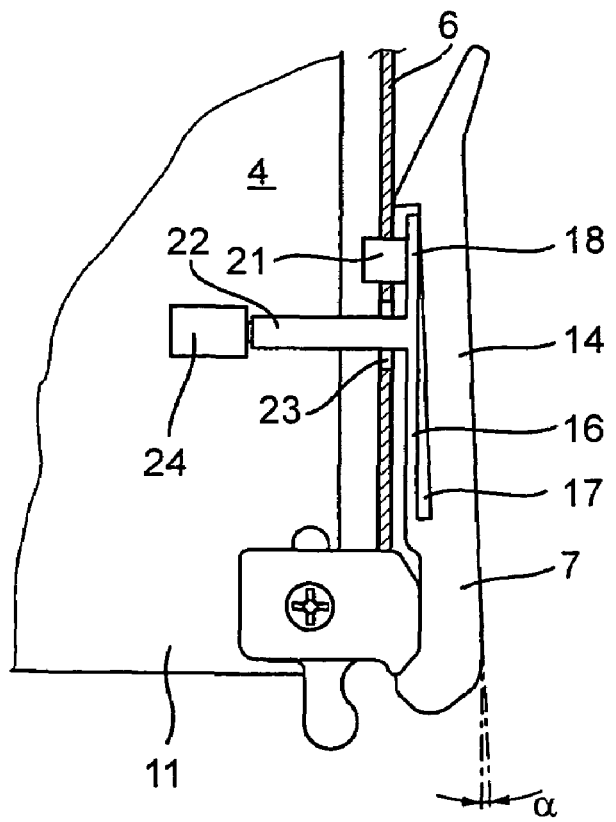
FIG. 5 is a detail view of the lower front corner of the plug-in circuit board shown in FIG. 4, but in the overtravel position.

FIG. 5 shows the plug-in circuit board 4 with the lever-latch handle 7 when the lever-latch handle 7 is pivoted beyond its intended end position in the direction of front plate 6. The gripping bar 14 of the lever-latch handle 7 is then pivoted by the angle a with respect to vertical. When the pivoting of the lever-latch handle 7 is past the intended end position, the force exerted on the lever-latch handle 7 or on the gripping bar 14 by the elastically deflectable tongue 16 will be cushioned until the maximum end and deflected position shown in FIG. 5 is reached. The tongue 16 will thereby always rest against the stop 21. The gap 17 between the tongue 16 and the gripping bar 14 will be reduced until the gripping bar 14 comes to rest against the free end 18 of the tongue 16. Damage to the front plate 6 and plug-in circuit board 4 will in this way be reliably prevented during pivoting past the intended end position. Also, the force exerted on the gripping bar 14 will not be transferred to the stem 22 and to the switch 24 on the circuit board 11 which has been actuated by the stem 22. Switch 24 is thus reliably protected from excessive pressure.

The pivoting movement of the lever-latch handle 7 is limited by the tongue 16 and the pivoting motion can only be carried out past the intended end position according to the width of the gap 17. Due to the overtravel of the lever-latch handle 7, the plug-in circuit board 4 will be securely and reliably positioned in the rack and the plug connection between the plug of the plug-in circuit board and the multiway connector will be established at the backplane of the rack. In this regard, a gap width of 0.2 mm to 2.0 mm is deemed to be sufficient and, preferably, the gap width should be about 0.5 mm to 1.0 mm.

As soon as the lever-latch handle 7 is no longer being pressed by an additional force in the direction of the front plate 6 and past the intended end position, the gripping bar 14 will be moved away from the front plate 6 by the elastic tongue 16. This occurs due to the elasticity of the tongue 16. The lever-latch handle 7 will thus be moved back in a spring-like manner to its intended end position, as illustrated in FIG. 4. This spring back of the lever-latch handle 7 has no effect on the positioning of the plug-in circuit board 4 in the rack, however, so that the plug-in circuit board 4 will remain in its inserted state. Also, the tongue 16 remains in its position and therefore the plug-in circuit board 4 is switched to become active, since the switch 24 will be actuated by the stem 22 as before.

Figure 6:
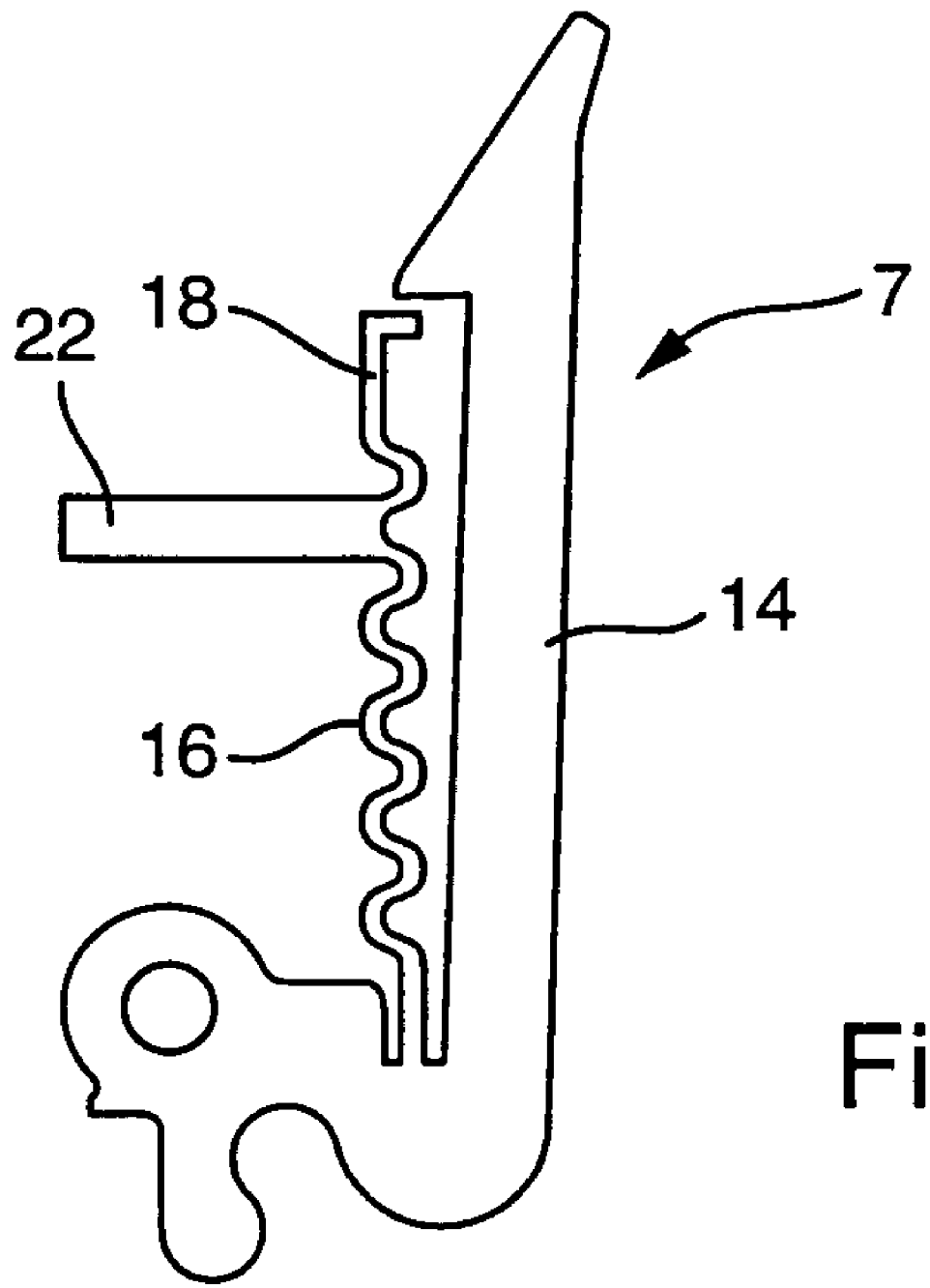
FIG. 6 is a detail view of a second alternate embodiment of a lever-latch handle in accordance with the invention.

FIG. 6 shows a second alternate embodiment of the lever-latch handle 7 wherein the tongue 16 has a sinuous shape. In particular, the portion of the tongue 16 extending between the stem 22 and the point of attachment of the tongue 16 to the lever-latch handle 7 is designed with a sinuous shape. A greater elasticity of the tongue 16 may be achieved in this configuration and forces exerted on the lever-latch handle 7 will be cushioned more. The lever-latch handle 7 can also be more easily pivoted beyond its intended end position in the direction of the plug-in circuit board. Establishing a plug in connection between plug-in circuit board and rack is simplified.

In the embodiment of FIG. 6, the free end 18 of the tongue 16 does not have a sinuous shape and in this region the tongue 16 is straight, so that it can engage in a reliable and defined manner with the stop 21 of the plug-in circuit board 4, and a specific adhesion force will develop between the tongue 16 and the plug-in circuit board.

Although preferred embodiments of the invention have been described in detail herein, those skilled in the art will recognize that various substitutions and modifications may be made without departing from the scope and spirit of the appended claims.

What is claimed is:

1. A plug-in circuit board for insertion into and withdrawal from a rack that includes at least one front rail, said plug-in circuit board including:
   a front plate; and
   a lever-latch handle including a gripping bar pivotably mounted on a front region of said plug-in circuit board wherein said gripping bar has an elastic tongue which in a pushed-in state of said plug-in circuit board adheres to said front plate by an attraction force applied to the gripping bar from an outward facing part of said front plate whereby said lever-latch handle is secured in its intended end position.

2. The plug-in circuit board according to claim 1, wherein: said tongue is formed of an elastically deflectable material.

3. The plug-in circuit board according to claim 1 wherein: said tongue includes a stem for making contact with a switch located behind said front plate.

4. The plug-in circuit board according to claim 1 wherein: said tongue is comprised of a flat portion for contacting the front plate at its face end and a portion having a sinuous shape.

5. The plug-in circuit board according to claim 1 wherein: a gap is formed between a free end of said tongue and said gripping bar so that said gripping bar can be pressed by the amount of said gap beyond its intended end position in the direction of said front plate.

6. The plug-in circuit board according to claim 5 wherein: said tongue is magnetically secured to said front plate.

7. The plug-in circuit board according to claim 6 wherein: a protruding stop which is magnetized is formed at said front plate such that, when said lever-latch handle is located in its intended end position, said free end of said tongue engages said stop with a magnetic attraction force.

8. A plug-in circuit board for insertion into and withdrawal from a rack, said plug-in circuit board including:
   a front plate;
   a movable lever-latch handle including a gripping bar pivotally mounted on a front region of said plug-in circuit board, a tongue disposed on and secured at one end to said gripping bar, an opposite end of said tongue being elastically deflectable with respect to said gripping bar and a gap formed between said opposite end of said tongue and said gripping bar whereby said gripping bar may be pressed by an amount of said gap beyond its intended end position in the direction of said front plate and;
   a protruding stop mounted on said front plate and engageable with said tongue when said gripping bar is in its intended end position.

9. The plug-in circuit board according to claim 8 wherein: said stop and said tongue are engageable with each other by a magnetic attraction force.

10. The plug-in circuit board according to claim 8 wherein: said tongue includes a stem projecting therefrom, said stem being engageable with a switch associated with said plug-in circuit board.

11. The plug-in circuit board according to claim 8 wherein: said tongue includes a sinuous shaped portion between said one end and said opposite end, the opposite end comprised of a flat section for contacting the front plate.

12. The plug-in circuit board of claim 8, further comprising means for adhering the opposite end of the tongue to the front plate in the intended end position.

13. A plug-in circuit board for insertion into and withdrawal from a rack, said plug-in circuit board including:
   a movable lever latch handle including a gripping bar pivotally mounted on a front region of said plug-in circuit board, said gripping bar including an elongated tongue secured to said gripping bar at one end, the opposite end of said tongue being elastically deflectable and disposed with respect to said gripping bar to form a gap between said opposite end of said tongue and said gripping bar, a stem disposed on said tongue and projecting therefrom for engagement with a switch disposed on said plug-in circuit board; and
   a stop engageable with said tongue, said stop and said tongue being formed of materials which provide for a magnetic attraction force between said tongue and said stop for adhering said lever-latch handle secured in its intended end position with said circuit board disposed on said rack.

* * * * *